(12) United States Patent
Lee

(10) Patent No.: US 9,836,216 B2
(45) Date of Patent: Dec. 5, 2017

(54) SEMICONDUCTOR MEMORY DEVICE AND OPERATING METHOD THEREOF

(71) Applicant: SK hynix Inc., Icheon-si, Gyeonggi-do (KR)

(72) Inventor: Hee Youl Lee, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/259,262

(22) Filed: Sep. 8, 2016

(65) Prior Publication Data

US 2017/0285950 A1    Oct. 5, 2017

(30) Foreign Application Priority Data

Mar. 29, 2016 (KR) .......................... 10-2016-0037537

(51) Int. Cl.
*G11C 8/00* (2006.01)
*G06F 3/06* (2006.01)

(52) U.S. Cl.
CPC ............ *G06F 3/0604* (2013.01); *G06F 3/064* (2013.01); *G06F 3/0659* (2013.01); *G06F 3/0679* (2013.01)

(58) Field of Classification Search
CPC ...... G06F 3/0604; G06F 3/064; G06F 3/0659; G06F 3/0679

USPC .................................................... 365/230.03
See application file for complete search history.

(56) References Cited

U.S. PATENT DOCUMENTS

| 9,053,796 | B2 * | 6/2015 | Shim | G11C 16/3418 |
| 9,275,745 | B2 * | 3/2016 | Won | G11C 7/02 |
| 9,330,766 | B1 * | 5/2016 | Jung | G11C 16/10 |
| 9,558,794 | B2 * | 1/2017 | Lee | G11C 7/00 |

FOREIGN PATENT DOCUMENTS

KR          101082756 B1    11/2011

* cited by examiner

*Primary Examiner* — Pho M Luu
(74) *Attorney, Agent, or Firm* — William Park & Associates Ltd.

(57) ABSTRACT

Provided herein is a semiconductor memory device and an operating method thereof. The semiconductor memory device may include a memory cell array, a peripheral circuit, and a control logic. The memory cell array may include a plurality of memory blocks. The peripheral circuit may perform a program operation or read operation on a selected memory block of the memory cell array. The control logic may select between a first program method and a second program method depending on program mode information for the selected memory block, and may control the peripheral circuit to perform the program operation on the selected memory block using the selected program method.

20 Claims, 6 Drawing Sheets

SEMICONDUCTOR MEMORY DEVICE AND OPERATING METHOD THEREOF

CROSS-REFERENCE TO RELATED APPLICATION

The present application claims priority under 35 U.S.C. §119(a) to Korean patent application number 10-2016-0037537 filed on Mar. 29, 2016 in the Korean Intellectual Property Office, the entire disclosure of which is incorporated herein by reference.

BACKGROUND

1. Technical Field

Various embodiments of the present disclosure generally relate to an electronic device, and more particularly to a semiconductor memory device and an operating method thereof.

2. Related Art

Semiconductor devices may be manufactured as integrated circuits. Semiconductor memory devices are data storage devices implemented on the integrated circuit. The semiconductor memory devices may be classified into a volatile memory device and a nonvolatile memory device.

The nonvolatile memory device can retain stored data even in the absence of power supply. Therefore, the nonvolatile memory device may be used for the task of secondary storage, which does not lose the data when the device is powered down. Representative examples of the nonvolatile memory device may include a Read Only Memory (ROM), a Mask ROM (MROM), a Programmable ROM (PROM), an Erasable Programmable ROM (EPROM), an Electrically Erasable Programmable ROM (EEPROM), a flash memory, a Phase change Random Access Memory (PRAM), a Magnetic RAM (MRAM), a Resistive RAM (RRAM), a Ferroelectric RAM (FRAM), etc. The flash memory may be classified into a NOR type and a NAND type.

Like a random access memory (RAM), the flash memory can be written and erased multiple times, and like a ROM, the flash memory can retain its data even when it is powered down. Such a flash memory is widely used as a storage medium of portable electronic devices such as a digital camera, a Personal Digital Assistant (PDA) and an MP3 player.

A memory cell array of the flash memory devices may have a two-dimensional structure in which memory cell strings are horizontally arranged on a semiconductor substrate. Alternatively, the memory cell array of the flash memory devices may have a three-dimensional structure in which the memory cell strings are vertically arranged on a semiconductor substrate.

SUMMARY

In an embodiment of the present disclosure, a semiconductor memory device may include a memory cell array, a peripheral circuit, and a control logic. The memory cell array may include a plurality of memory blocks. The peripheral circuit may perform a program operation or read operation on a selected memory block of the memory cell array. The control logic may select between a first program method and a second program method depending on program mode information for the selected memory block, and may control the peripheral circuit to perform the program operation on the selected memory block using the selected program method. If the selected memory block is a memory block that has only erased memory cells, the first program method is selected, and if the selected memory block is a memory block that has both the erased memory cells and programmed memory cells, the second program method is selected.

In an embodiment of the present disclosure, an operating method of a semiconductor memory device may include inputting a program command for a selected memory block among a plurality of memory blocks. The operating method may include checking a program state of the selected memory block according to program mode information for the selected memory block stored in a Content-Addressable Memory (CAM) block among the plurality of memory blocks. The operating method may include selecting between a first program method, which programs data on an erased memory block, and a second program method, which programs data on a programmed memory block, depending on program mode information for the selected memory block. The operating method may include performing a program operation on the selected memory block by the first program method if the selected memory block is a memory block that has only erased memory cells, and performing the program operation for the selected memory block by the second program method if the selected memory block is a memory block that has both the erased memory cells and programmed memory cells.

In an embodiment of the present disclosure, an operating method of a semiconductor memory device may include inputting a read command for a selected memory block among a plurality of memory blocks. The operating method may include checking a program state of the selected memory block according to program mode information for the selected memory block stored in a Content-Addressable Memory (CAM) block among the plurality of memory blocks. The operating method may include selecting between a first read method and a second read method depending on program mode information for the selected memory block. The operating method may include performing a read operation on the selected memory block by a first read method if the selected memory block is a memory block programmed by a first program method, which programs data on an erased memory block, and performing the read operation on the selected memory block by the second read method if the selected memory block is a memory block programmed by a second program method, which programs data on a programmed memory block.

DETAILED DESCRIPTION

Figure 1:
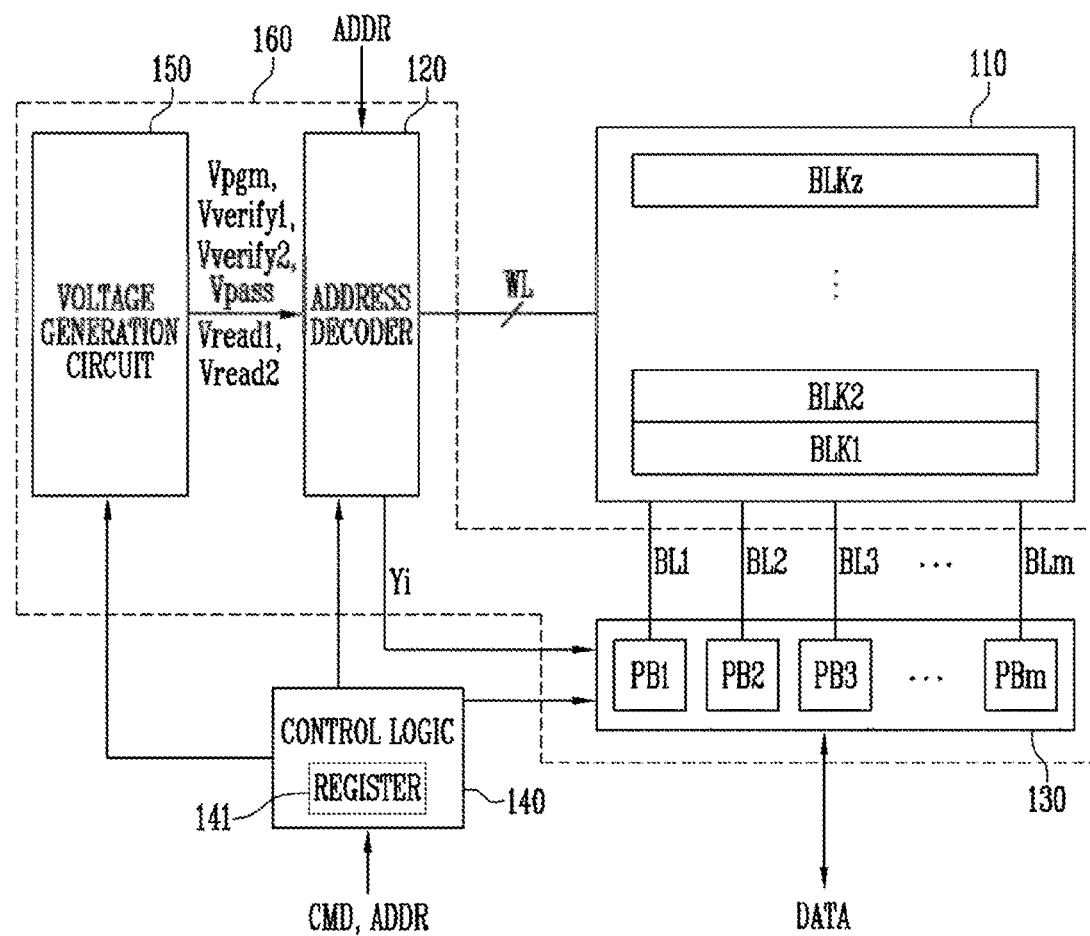
FIG. 1 is a diagram illustrating an example of a semiconductor memory device according to an embodiment of the present disclosure.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

Hereinafter, embodiments will be described in greater detail with reference to the accompanying drawings. Embodiments are described herein with reference to cross-sectional illustrations that are schematic illustrations of embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements.

Terms such as 'first' and 'second' may be used to describe various components, but they should not limit the various components. Those terms are only used for the purpose of differentiating a component from other components. For example, a first component may be referred to as a second component, and a second component may be referred to as a first component and so forth without departing from the spirit and scope of the present disclosure. Furthermore, 'and/or' may include any one of or a combination of the components mentioned.

Furthermore, a singular form may include a plural from as long as it is not specifically mentioned in a sentence. Furthermore, "include/comprise" or "including/comprising" used in the specification represents that one or more components, steps, operations, and elements exist or are added.

Furthermore, unless defined otherwise, all the terms used in this specification including technical and scientific terms have the same meanings as would be generally understood by those skilled in the related art. The terms defined in generally used dictionaries should be construed as having the same meanings as would be construed in the context of the related art, and unless clearly defined otherwise in this specification, should not be construed as having idealistic or overly formal meanings.

It is also noted that in this specification, "connected/coupled" refers to one component not only directly coupling another component but also indirectly coupling another component through an intermediate component. On the other hand, "directly connected/directly coupled" refers to one component directly coupling another component without an intermediate component.

FIG. 1 is a diagram illustrating an example of a semiconductor memory device according to an embodiment of the present disclosure.

Referring to FIG. 1, the semiconductor memory device 100 may include a memory cell array 110, an address decoder 120, a read/write circuit 130, a control logic 140, and a voltage generation circuit 150. The address decoder 120, the read/write circuit 130, and the voltage generation circuit 150 may be defined as peripheral circuits which perform a program operation for the memory cell array 110.

A plurality of memory cells of the semiconductor memory device 100 may be arranged in the memory cell array 110. The memory cells of the memory cell array 110 may be grouped into a plurality of memory blocks BLK1 to BLKz. Among the plurality of memory blocks BLK1 to BLKz, at least one memory block may be a Content-Addressable Memory (CAM) block (e.g., BLKz), and the other memory blocks BLK1 to BLKz-1 may be normal memory blocks. The CAM block (e.g., BLKz) may store program mode information indicating which program method is used to program the normal memory blocks BLK1 to BLKz-1.

The plurality of memory blocks BLK1 to BLKz may be coupled to the address decoder 120 through word lines WL, and may be coupled to the read/write circuit 130 through bit lines BL1 to BLm. In an embodiment, the plurality of memory cells may be nonvolatile memory cells. For example, the memory cells may include charge trap layers to store information therein. Alternatively, the memory cells may include floating gates to store information therein. A plurality of memory cells coupled in common to a single word line may be defined as one page. Therefore, the memory cell array 110 may include a plurality of pages.

In addition, each of the memory blocks BLK1 to BLKz of the memory cell array 110 may include a plurality of memory cell strings. Each of the memory cell strings may include a drain select transistor, a plurality of drain side memory cells, a plurality of source side memory cells, and a source select transistor, which are coupled in series between a bit line and a source line.

The address decoder 120 may be coupled to the memory cell array 110 through the word lines WL. The address decoder 120 may operate in response to control signals of the control logic 140. The semiconductor memory device 100 may further include an input/output buffer (not illustrated). The address decoder 120 may receive an address ADDR through the input/output buffer.

The address ADDR may include a block address that is used to select one or more of the memory blocks BLK1 to BLKz of the memory cell array 110. The address decoder 120 may decode address ADDR to obtain a row address. During a program operation, the address decoder 120 may apply a program voltage Vpgm, a first program verification voltage Vverify1, a second program verification voltage Vverify2, a pass voltage Vpass, and a pass Vpass, which are generated by the voltage generation circuit 150, to a plurality of word lines WL of the memory cell array 110 in accordance with the row address obtained by decoding the address ADDR. During a read operation, the address decoder 120 may apply a first read voltage Vread1, a second read voltage Vread2, and a pass Vpass, which are generated by the voltage generation circuit 150, to a plurality of word lines WL of the memory cell array 110 in accordance with the row address obtained by decoding the address ADDR.

The address ADDR received to perform a program operation or a read operation may include a block address, a row address, and a column address. The row address may be defined as a page address. The address decoder 120 may select a corresponding one of the memory blocks and a corresponding one of the word lines in accordance with the block address and the row address. The column address Yi may be obtained by decoding the address ADDR at the address decoder 120, and may be provided to the read and write circuit 130.

The address decoder 120 may include a block decoder, a row decoder, a column decoder, an address buffer, etc.

The read/write circuit 130 may include a plurality of page buffers PB1 to PBm. The plurality of page buffers PB1 to PBm may be coupled to the memory cell array 110 through the bit lines BL1 to BLm. During the program operation, each of the page buffers PB1 to PBm may temporarily store data DATA input, and may control a potential of a corresponding one of the bit lines BL1 to BLm in accordance with the temporarily stored data. Furthermore, each of the page buffers PB1 to PBm may sense a bit-line potential of a corresponding one of the bit lines BL1 to BLm (or the amount of current flowing through a corresponding one of the bit lines BL1 to BLm) during a program verification operation or during a read operation. The page buffers PB1 to PBm may temporarily store read data, and then may output it to an external device. The read/write circuit 130 may operate in response to control signals of the control logic 140.

The control logic 140 may be coupled to the address decoder 120, the read/write circuit 130, and the voltage generation circuit 150. The control logic 140 may include a register 141.

The control logic 140 may receive a command CMD and an address ADDR through an input/output buffer (not illustrated) of the semiconductor memory device 100. The control logic 140 may control the overall operation of the semiconductor memory device 100 in response to the command CMD.

When a command CMD corresponding to a program command is input, the control logic 140 may read, before performing a program operation, program mode information of a selected memory block stored in the CAM block (e.g., BLKz) among the plurality of memory blocks BLK to BLKz included in the memory cell array 110, and may store the program mode information in the register 141 and then determine which program method will be used for the selected memory block depending on the program mode information stored in the register 141 and control the operation of the peripheral circuit 160 accordingly. The program method may include a first program method and a second program method. The first program method may be a program method that is performed on an erased memory block (i.e., a memory block with only erased memory cells). The first program method may be a normal program operation. The second program method may be a program method that is performed on a programmed memory block (i.e., a memory block with programmed memory cells and erased memory cells). The second program method may be an additional program operation performed on the programmed memory block without performing an erase operation thereon in advance. If the program mode information of the selected memory block indicates that the selected memory block is the erased memory block, the control logic 140 may set the program method for the selected memory block to the first program method. If the program mode information of the selected memory block indicates that the selected memory block is the programmed memory block, the control logic 140 may set the program method for the selected memory block to the second program method. Furthermore, if the program mode information of the selected memory block indicates that the selected memory block has been programmed by the second program method, the control logic 140 may control the operation of the peripheral circuit 160 to perform an erase operation on the selected memory block first and then to program the selected memory block with the first program method.

If the program operation for the selected memory block is set to the first program method, the control logic 140 may control the operation of the voltage generation circuit 150 to generate the first program verification voltage Vverify1 as the program verification voltage. If the program operation for the selected memory block is set to the second program method, the control logic 140 may control the operation of the voltage generation circuit 150 to generate the second program verification voltage Vverify2 as the program verification voltage. The second program verification voltage Vverify2 may be higher than a maximum threshold voltage level of a threshold voltage distribution of the highest program state of the memory block programmed by the first program method.

Furthermore, the control logic 140 may update program mode information of the selected memory block on the CAM block while the program operation for the selected memory block is being performed or after the program operation has been completed.

When a command CMD corresponding to a read command is input, the control logic 140 may read, before performing a read operation, program mode information of a selected memory block stored in the CAM block (e.g., BLKz) among the plurality of memory blocks BLK to BLKz included in the memory cell array 110. The control logic 140 may store the program mode information in the register 141 and then, in order to perform a read operation on the selected memory block, select between a first read method and a second read method depending on the program mode information stored in the register 141. For instance, if the memory block selected according to the program mode information is a memory block programmed by the first program method, the control logic 140 may select the first read method, and thus a first read voltage Vread1 may be used as the read voltage. Furthermore, if the memory block selected according to the program mode information is a memory block programmed by the second program method, the control logic 140 may select the second read method, and thus a second read voltage Vread1 may be used as the read voltage. The control logic 140 may control the operation of the peripheral circuit 160 to perform the read operation according to the selected read method. The second read voltage Vread1 may be higher than a maximum threshold voltage level of a threshold voltage distribution of the highest program state of the memory block programmed by the first program method.

During the program operation, the voltage generation circuit 150 may generate the program voltage Vpbm, the pass voltage Vpass, the first and second verification voltages Vverify1 and Vverify2, and the first and second read voltages Vread1 and Vread2 in response to the control signals of the control logic 140.

As described above, in an embodiment of the present disclosure, even when the memory block selected during the program operation is in a programmed state, an additional program operation (e.g., the second program method) may be performed on the programmed memory block without performing an erase operation thereon in advance. Furthermore, if the selected memory block is a memory block programmed by using the additional program operation (e.g., the second program method), an erase operation may be performed before a program operation is performed.

Figure 2:
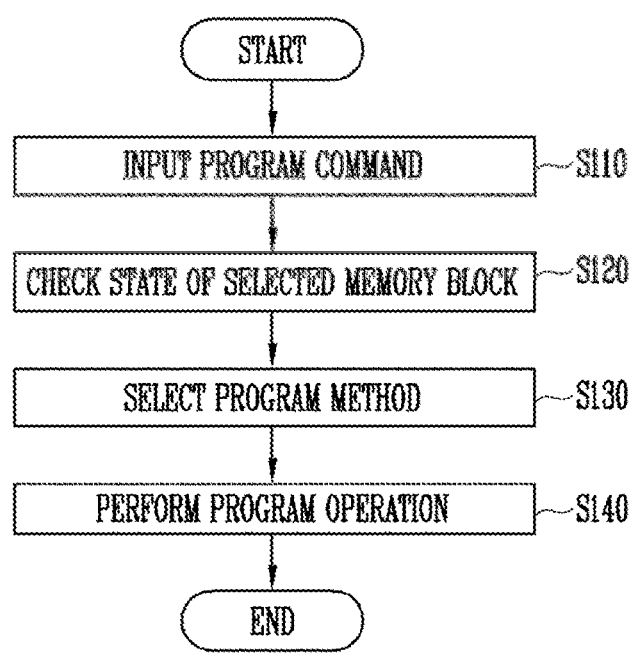
FIG. 2 is a flowchart illustrating an example of a program operation method of the semiconductor memory device according to an embodiment of the present disclosure.

FIG. 2 is a flowchart illustrating an example of a program operation method of the semiconductor memory device according to an embodiment of the present disclosure.

Figure 3:
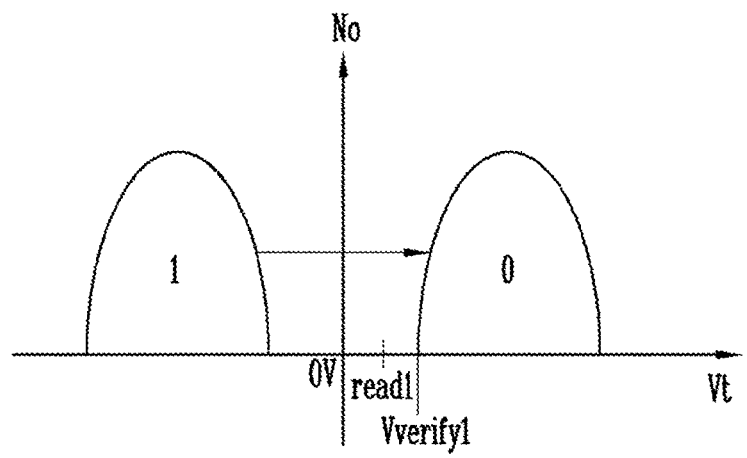
FIG. 3 is a diagram illustrating an example of a threshold voltage distribution of a first program operation and a first read operation according to an embodiment of the present disclosure.

FIG. 3 is a diagram illustrating an example of a threshold voltage distribution of the first program operation and the first read operation according to an embodiment of the present disclosure.

Figure 4:
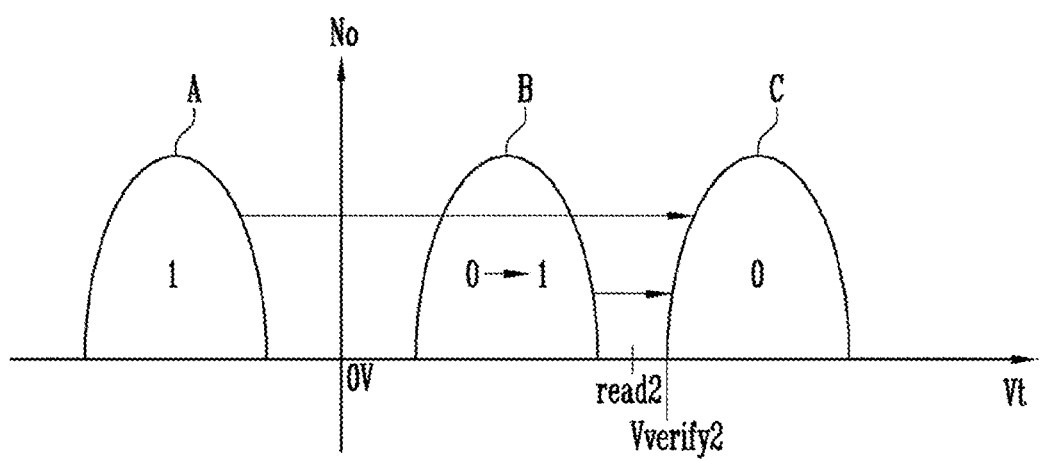
FIG. 4 is a diagram illustrating an example of a threshold voltage distribution of a second program operation and a second read operation according to an embodiment of the present disclosure.

FIG. 4 is a diagram illustrating an example of a threshold voltage distribution of the second program operation and the second read operation according to an embodiment of the present disclosure.

The program operation method of the semiconductor memory device according to an embodiment of the present disclosure will be described with reference to FIGS. 1 to 4.

In response to a command CMD for a program command (at S110), the control logic 140 may control the operation of the peripheral circuit 160 to perform a program operation of the semiconductor memory device.

The read/write circuit 130 may temporarily store data DATA to be programmed.

The page buffers PB1 to PBm may control bit-line potentials of the corresponding bit lines BL1 to BLm, respectively, according to the temporarily stored data. That is, each of the page buffers PB1 to PBm may apply a program enable voltage (e.g., 0 V) or a program inhibit voltage (e.g., Vcc) to a corresponding one of the bit lines BL1 to BLm according to the temporarily stored data.

The control logic 140 may select at least one memory block (e.g., BLK1) among the memory blocks BLK1 to BLKz according to an address ADDR input along with the program command.

Furthermore, to check conditions of the selected memory block (e.g., BLK1), the control logic 140 may read the program mode information of the selected memory block BLK1 stored in the CAM block (e.g., BLKz). The control logic 140 may store the program mode information in the register 141 and decode it (at S120).

The control logic 140 may select a program method of the selected memory block according to the program mode information stored in the register 141 and control the operation of the peripheral circuit 160 accordingly (at S130).

For example, if the program mode information of the selected memory block indicates that the selected memory block is in an erased state as an erase operation has been performed, the control logic 140 may set the program method for the selected memory block to the first program method. Furthermore, if the program mode information of the selected memory block indicates that the selected memory block has been programmed by the first program method, the control logic 140 may set the program method to the second program method. The program operation of the second program method may be performed by means of an Incremental Step Pulse Program (ISPP) method. Depending on a threshold voltage state of a memory cell to be programmed, a voltage amplitude of a first program pulse starting the ISPP method may vary. For example, in a case where the memory cell to be programmed has a threshold voltage value corresponding to data "1" of FIG. 3, the ISPP program operation may start from a first program pulse with a first voltage amplitude. In a case where the memory cell to be programmed has a threshold voltage value corresponding to data "0" of FIG. 3, the ISPP program operation may start from a first program pulse with a second voltage amplitude higher than the first voltage amplitude.

Further, before the program operation of the second program method is performed, a pre-program operation may be performed. In the pre-program operation, threshold voltages of memory cells to be programmed may be increased by a predetermined value. By performing the program operation of the second program method after the pre-program operation, a threshold voltage distribution width may be improved.

Furthermore, if the program mode information of the selected memory block indicates that the selected memory block has been programmed by means of the second program method, the control logic 140 may control the operation of the peripheral circuit 160 to perform an erase operation on the selected memory block before performing a program operation by means of the first program method.

After the program method is set by the control logic 140 at the step S130, the program operation may be performed according to the set program method (at S140).

The program operation that is performed by means of the first program method will be described below.

The program operation may repeat a program loop including a program voltage applying operation and a program verification operation.

During the program voltage applying operation, the control logic 140 may control the operation of the voltage generation circuit 150 to generate a program voltage Vpgm and a pass voltage Vpass. The voltage generation circuit 150 may generate a program voltage Vpgm and a pass voltage Vpass in response to control signals of the control logic 140. The generated program voltage Vpgm and pass voltage Vpass may be applied to word lines of a memory block BLK1 selected by the address decoder 120.

Thereafter, the program verification operation may be performed. During the program verification operation, the control logic 140 may control the operation of the voltage generation circuit 150 to generate a first program verification voltage Vverify1 and a pass voltage Vpass. The voltage generation circuit 150 may generate a first program verification voltage Vverify1 and a pass voltage Vpass in response to control signals of the control logic 140. The generated first program verification voltage Vverify1 and pass voltage Vpass may be applied to the word lines of the selected memory block BLK1. During the program verification operation, each of the page buffers PB1 to PBm may sense a bit-line potential of a corresponding one of the bit lines BL1 to BLm (or the amount of current flowing through a corresponding one of the bit lines BL1 to BLm). If a selected memory cell has not passed the verification, the control logic 140 may control the operation of the voltage generation circuit 150 to increase the program voltage Vpgm by a step voltage and then reperform the program operation with the increased program voltage Vpgm.

In this way, the memory cells of the selected memory block BLK1 may be programmed such that, as illustrated in FIG. 3, some of the memory cells having a threshold voltage of an erase state "1" are programmed to a threshold voltage distribution of a program state "0." Therefore, the memory cells are programmed to a threshold voltage distribution of the erase state "1" and a threshold voltage distribution of the program state "0."

The control logic 140 may newly update the program mode information of the selected memory block on the CAM block while the program operation for the selected memory block is being performed or after the program operation has been completed.

The program operation that is performed by means of the second program method will be described below.

In a case where a selected memory block (e.g., BLK1) includes memory cells of an erase state "1" and a program state "0," as illustrated in FIG. 3, the program operation for the selected memory block may be set to the second program method.

During the program voltage applying operation, the control logic 140 may control the voltage generation circuit 150 to generate a program voltage Vpgm and a pass voltage Vpass. The voltage generation circuit 150 may generate a program voltage Vpgm and a pass voltage Vpass in response to control signals of the control logic 140. The generated program voltage Vpgm and the pass voltage Vpass may be applied to word lines of a memory block BLK1 selected by the address decoder 120.

Thereafter, the program verification operation may be performed. During the program verification operation, the control logic 140 may control the operation of the voltage generation circuit 150 to generate a second program verification voltage Vverify2 and a pass voltage Vpass. The voltage generation circuit 150 may generate a second program verification voltage Vverify2 and a pass voltage Vpass in response to control signals of the control logic 140. The generated second program verification voltage Vverify2 and pass voltage Vpass may be applied to the word lines of the selected memory block BLK1. During the program verification operation, each of the page buffers PB1 to PBm may sense a bit-line potential of a corresponding one of the bit lines BL1 to BLm (or the amount of current flowing through a corresponding one of the bit lines BL1 to BLm). If a selected memory cell has not passed the verification, the control logic 140 may control the operation of the voltage generation circuit 150 to increase the program voltage Vpgm by a step voltage and then reperform the program operation with the increased program voltage Vpgm.

By the program operation performed by means of the second program method, the selected memory block (e.g., BLK1) having the threshold voltage distribution illustrated in FIG. 3 may be programmed to a threshold voltage distribution illustrated in FIG. 4.

If the selected memory block (e.g., BLK1) is a memory block that has been programmed by means of the first program method and thus has both the threshold voltage distribution of the erase state "1" and the threshold voltage distribution of the program state "0" as illustrated in FIG. 3, a subsequent program operation may be performed on the selected memory block without performing an erase operation. In order to perform a program operation on the selected memory block, which is an already programmed memory block, without performing an erase operation, the subsequent program operation may be performed by means of the second program method, some memory cells among the memory cells having a threshold voltage distribution of the erase state "1"(A) and a threshold voltage distribution of the program state "0"(B) illustrated in FIG. 4 are programmed to have a threshold voltage distribution of the program state "0"(C) illustrated in FIG. 4. If memory cells having the threshold voltage distribution of the erase state "1" and the threshold voltage distribution of the program state "0" illustrated in FIG. 3 are not programmed, their threshold voltages may remain unchanged, and the program state of the threshold voltage distribution of the program state "0" illustrated in FIG. 3 may be changed to a new erase state "0"→"1"(B) illustrated in FIG. 4.

The control logic 140 may newly update the program mode information of the selected memory block on the CAM block while the program operation for the selected memory block is being performed or after the program operation has been completed.

Figure 5:
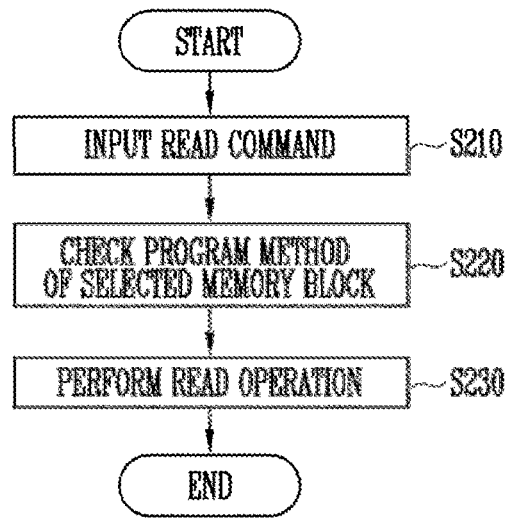
FIG. 5 is a flowchart illustrating an example of a read operation method according to an embodiment of the present disclosure.

FIG. 5 is a flowchart illustrating an example of a read operation method according to an embodiment of the present disclosure.

The read operation of the semiconductor memory device according to an embodiment of the present disclosure will be described with reference to FIGS. 1, 3, 4 and 5.

In response to a command CMD for a read command (at S210), the control logic 140 may control the operation of the peripheral circuit 160 to perform a read operation on the semiconductor memory device.

The control logic 140 may select at least one memory block (e.g., BLK1) among the memory blocks BLK1 to BLKz according to an address ADDR input along with the read command.

Furthermore, to check the program method of the selected memory block (e.g., BLK1), the control logic 140 may read the program mode information of the selected memory block BLK1 stored in the CAM block (e.g., BLKz). The control logic 140 may store the program mode information in the register 141 and decode it (at S220).

The control logic 140 may select a read method of the selected memory block according to the program mode information stored in the register 141 and control the operation of the peripheral circuit 160 to perform the read operation accordingly (at S230).

For example, if the program mode information of the selected memory block indicates that the selected memory block has been programmed by means of the first program method, the control logic 140 may set the read method for the selected memory block to a first read method. Furthermore, if the program mode information of the selected memory block indicates that the selected memory block has been programmed by means of the second program method, the control logic 140 may set the read method for the selected memory block to a second read method.

The read operation that is performed by means of the first read method will be described below.

During the read operation, the control logic 140 may control the operation of the voltage generation circuit 150 to generate a first read voltage Vread1 and a pass voltage Vpass. The voltage generation circuit 150 may generate a first read voltage Vread1 and a pass voltage Vpass in response to control signals of the control logic 140. The generated first read voltage Vread1 and pass voltage Vpass may be applied to word lines of a memory block BLK1 selected by the address decoder 120.

During the read operation, each of the page buffers PB1 to PBm may sense a bit-line potential of a corresponding one of the bit lines BL1 to BLm (or the amount of current flowing through a corresponding one of the bit lines BL1 to BLm).

If the memory cells of the selected memory block BLK1 have a threshold voltage distribution of an erase state "1" and a threshold voltage distribution of a program state "0" as illustrated in FIG. 3, the read operation may be performed by means of the first read method. Therefore, the read operation may be performed using the first read voltage Vread1.

The read operation that is performed by means of the second read method will be described below.

If a selected memory block (e.g., BLK1) has memory cells of more than one erase state, for example, a threshold voltage distribution of the erase state "1"(A) and a threshold voltage distribution of another erase state "0→1"(B), and a threshold voltage distribution of program state "0"(C) as illustrated in FIG. 4, a read operation may be performed by means of the second read method.

During the read operation, the control logic 140 may control the operation of the voltage generation circuit 150 to generate a second read voltage Vread2 and a pass voltage Vpass. The voltage generation circuit 150 may generate a second read voltage Vread2 and a pass voltage Vpass in response to control signals of the control logic 140. The generated second read voltage Vread2 and pass voltage Vpass may be applied to word lines of a memory block BLK1 selected by the address decoder 120.

During the read operation, each of the page buffers PB1 to PBm may sense a bit-line potential of a corresponding one of the bit lines BL1 to BLm (or the amount of current flowing through a corresponding one of the bit lines BL1 to BLm).

When the read operation is performed by means of the second read method, it is possible to distinguish the memory cells of the erase states (A: "1", B: and "0→1" illustrated in FIG. 4) from the memory cells of the program state (C: "0" illustrated in FIG. 4) by reading the memory cells with the second read voltage Vread2.

Figure 6:
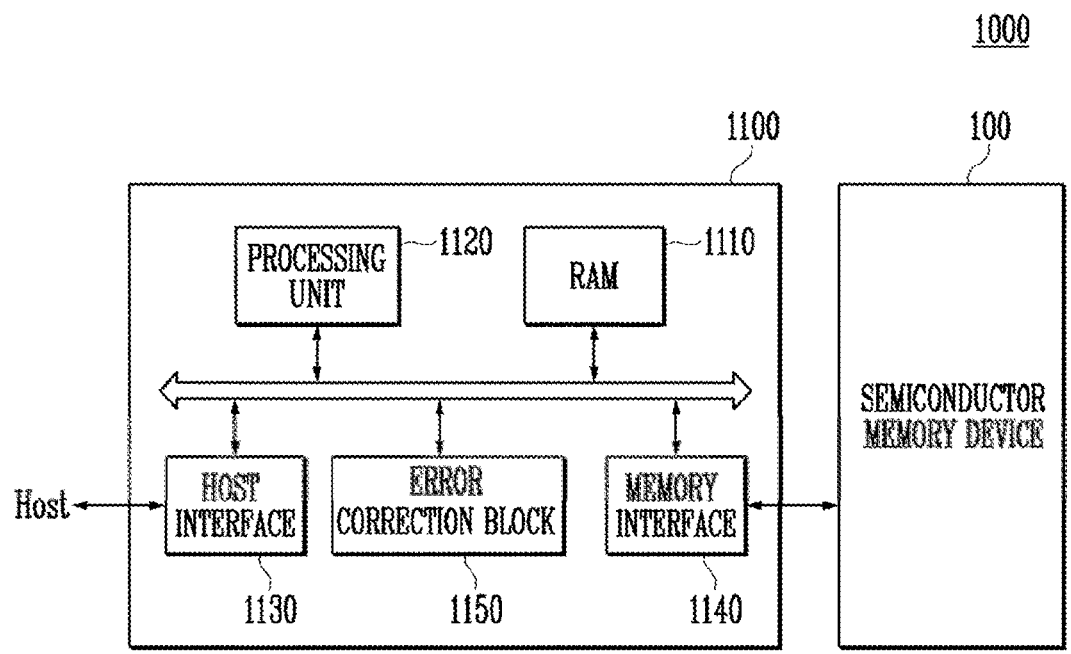
FIG. 6 is a diagram illustrating a memory system including the semiconductor memory device of FIG. 1.

FIG. 6 is a diagram illustrating a memory system including the semiconductor memory device of FIG. 1.

In FIG. 6, the memory system 1000 may include a semiconductor memory device 100 and a controller 1100.

Configurations and operations of the semiconductor memory device 100 may be the same as those of the semiconductor memory device described with reference to FIG. 1, and thus any repetitive detailed description will be omitted or simplified.

The controller 1100 may be coupled to a host Host and the semiconductor memory device 100. The controller 1100 is configured to access the semiconductor memory device 100 in response to a request from the host Host. For example, the controller 1100 is configured to control read, write, erase, and background operations of the semiconductor memory device 100. The controller 1100 may provide an interface between the host Host and the semiconductor memory device 100. The controller 1100 may drive firmware for controlling the semiconductor memory device 100.

The controller 1100 may include a Random Access Memory (RAM) 1110, a processing unit 1120, a host interface 1130, a memory interface 1140, and an error correction block 1150. The RAM 1110 may be used as at least one of an operation memory of the processing unit 1120, a cache memory between the semiconductor memory device 100 and the host Host, and a buffer memory between the semiconductor memory device 100 and the host Host. The processing unit 1120 may control the overall operation of the controller 1100. In addition, the controller 1100 may temporarily store program data provided from the host Host during the write operation.

The host interface 1130 may include a protocol for performing data exchange between the host Host and the controller 1100. In an embodiment, the controller 1200 may communicate with the host Host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol, a private protocol, and the like.

The memory interface 1140 may interface with the semiconductor memory device 100. For example, the memory interface may include a NAND interface or NOR interface.

The error correction block 1150 may use an error correction code (ECC) to detect and correct an error in data received from the semiconductor memory device 100. In an embodiment, the error correction block may be provided as an element of the controller 1100.

The controller 1100 and the semiconductor memory device 100 may be integrated into a single semiconductor device. In an embodiment, the controller 1100 and the semiconductor memory device 100 may be integrated into a memory card. For example, the controller 1100 and the semiconductor memory device 100 may be integrated into a single semiconductor device and form a memory card such as a personal computer memory card international association (PCMCIA), a compact flash card (CF), a smart media card (SM or SMC), a memory stick multimedia card (e.g., MMC, RS-MMC, or MMCmicro), a SD card (e.g., SD, miniSD, microSD, or SDHC), a universal flash storage (UFS), and the like.

The controller 1100 and the semiconductor memory device 100 may be integrated into a single semiconductor device to form a solid state drive (SSD). The SSD includes a storage device formed to store data in a semiconductor memory.

In an embodiment, the memory system 1000 may be provided as one of various elements of an electronic device such as a computer, a ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, one of various elements for forming a computing system, or the like.

In an embodiment, the semiconductor memory device 100 or the memory system 1000 may be embedded in various types of packages. Examples of the packages may include Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), or the like.

Figure 7:
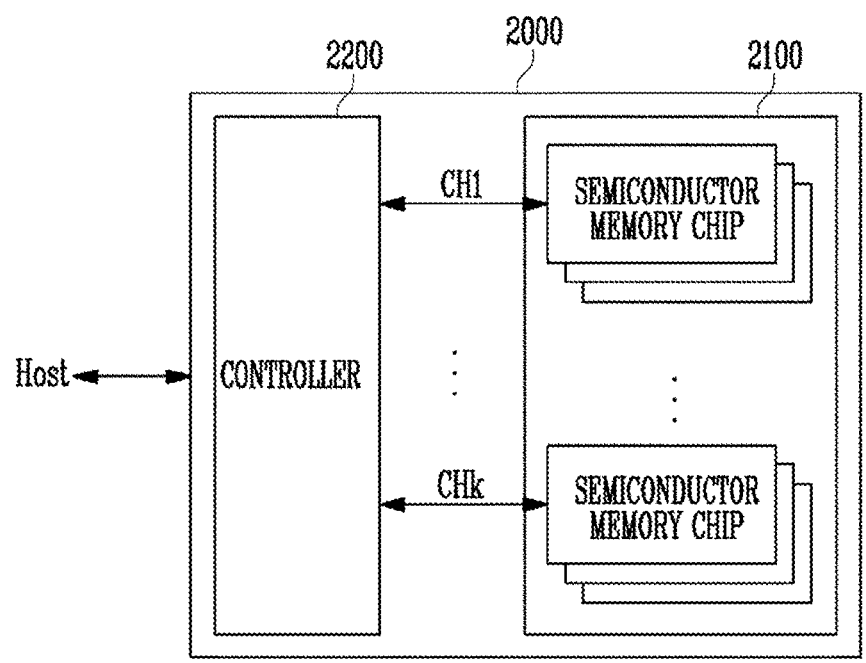
FIG. 7 is a diagram illustrating an application example of the memory system of FIG. 6.

FIG. 7 is a diagram illustrating an application example of the memory system of FIG. 6.

Referring FIG. 7, the memory system 2000 may include a semiconductor memory device 2100 and a controller 2200. The semiconductor memory device 2100 may include a plurality of memory chips. The semiconductor memory chips may be divided into a plurality of groups.

In FIG. 7, it is illustrated that the plurality of groups respectively communicates with the controller 2200 through first to $k^{th}$ channels CH1 to CHk. Configurations and operations of the semiconductor memory chips illustrated in FIG. 7 may be the same as those of the semiconductor memory device 100 described with reference to FIG. 1.

Each group may communicate with the controller 2200 through a common channel. The controller 2200 may have the same configuration as that of the controller 1100 described with reference to FIG. 6, and may control operations of memory chips of the semiconductor memory device 2100 through the plurality of channels CH1 to CHk.

Figure 8:
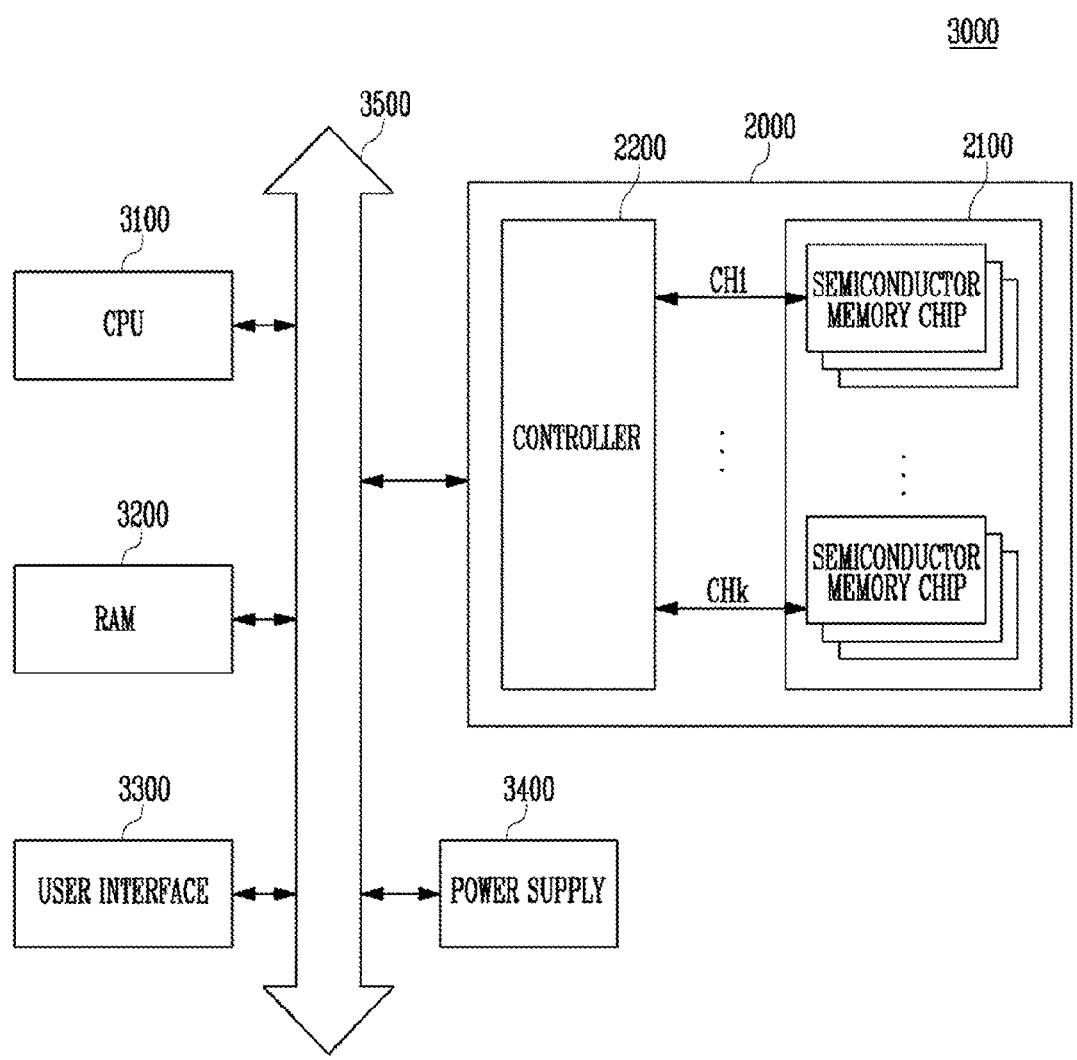
FIG. 8 is a diagram illustrating an example of a computing system including the memory system illustrated with reference to FIG. 7.

FIG. 8 is a diagram illustrating an example of a computing system including the memory system illustrated with reference to FIG. 7.

Referring to FIG. 8, the computing system 3000 may include a central processing unit 3100, a RAM 3200, a user interface 3300, a power supply 3400, a system bus 3500, and a memory system 2000.

The memory system 2000 may be electrically coupled to the CPU 3100, the RAM 3200, the user interface 3300, and the power supply 3400 through the system bus 3500. Data provided through the user interface 3300 or processed by the CPU 3100 may be stored in the memory system 2000.

In FIG. 8, the semiconductor memory device 2100 is illustrated as being coupled to the system bus 3500 through the controller 2200. However, the semiconductor memory device 2100 may be directly coupled to the system bus 3500. The function of the controller 2200 may be performed by the CPU 3100 and the RAM 3200.

In FIG. 8, it is illustrated that the memory system 2000 described with reference to FIG. 7 is being used. However, the memory system 2000 may be replaced with the memory system 1000 described with reference to FIG. 6. In an embodiment, the computing system 3000 may include all of the memory systems 1000 and 2000 described with reference to FIGS. 6 and 7.

According to an embodiment of the present disclosure, during a program operation of a semiconductor memory device, an additional program operation can be performed on a programmed memory cell without performing a separate erase operation, and thus the overall program operation time may be reduced.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor memory device comprising:
   a memory cell array including a plurality of memory blocks;
   a peripheral circuit configured to perform a program operation or read operation on a selected memory block of the memory cell array; and a control logic configured to select between a first program method and a second program method depending on program mode information for the selected memory block, and control the peripheral circuit to perform the program operation on the selected memory block using the selected program method,
   wherein, the first program method is selected if the selected memory block has only erased memory cells, and the second program method is selected if the selected memory block has both the erased memory cells and programmed memory cells.

2. The semiconductor memory device according to claim 1, wherein the program mode information indicates whether the selected memory block is a memory block that has only erased memory cells or a memory block that has both erased memory cells and programmed memory cells.

3. The semiconductor memory device according to claim 2, wherein, during the program operation of the first program method, a threshold voltage distribution of a memory cell to be programmed is increased from an erase state to a program state.

4. The semiconductor memory device according to claim 2, wherein, when the selected memory block is a memory block that has both erased memory cells and programmed memory cells, the program mode information indicates whether the selected memory block has been programmed by the first program method or the second program method.

5. The semiconductor memory device according to claim 4, wherein, during the program operation, if it is determined that the selected memory block is a memory block programmed by the first program method according to the program mode information, the program operation is performed by the second program method such that a threshold voltage distribution of a memory cell to be programmed is increased from an erase state to a program state if the memory cell is in the erased state and the threshold voltage distribution of the memory cell to be programmed is increased from the program state to another program state higher than the program state if the memory cell is in the program state.

6. The semiconductor memory device according to claim 4, wherein, during the program operation, if it is determined that the selected memory block is a memory block programmed by the second program method according to the program mode information, the selected memory block is erased and then the program operation is performed by the first program method.

7. The semiconductor memory device according to claim 4, wherein, during the read operation, the control logic selects between a first read method using a first read voltage and a second read method using a second read voltage depending on the program mode information.

8. The semiconductor memory device according to claim 7, wherein, during the read operation, if it is determined that the selected memory block is a memory block programmed by the first program method according to the program mode information, the read operation is performed by the first read method, and if it is determined that the selected memory block is a memory block programmed by the second program method according to the program mode information, the read operation is performed by the second read method.

9. The semiconductor memory device according to claim 7, wherein the second read voltage is higher than a maximum threshold voltage level of a threshold voltage distribution of a program state of a memory block programmed by the first program method.

10. The semiconductor memory device according to claim 1, wherein the plurality of memory blocks includes at least one Content-Addressable Memory (CAM) block, and the program mode information is stored in the CAM block.

11. The semiconductor memory device according to claim 10, wherein the control logic includes a register, and when a command for the program operation or read operation is input, the program mode information of the selected memory block stored in the CAM block is read and stored in the register.

12. The semiconductor memory device according to claim 10, wherein, after the program operation has been completed, the control logic updates the program mode information for the selected memory block and stores the updated program mode information in the CAM block.

13. The semiconductor memory device according to claim 1, wherein the first program method repeatedly performs a first program loop including a program voltage applying operation and a first program verification operation using a first program verification voltage, and the second program method repeatedly performs a second program loop including the program voltage applying operation and a second program verification operation using a second program verification voltage.

14. The semiconductor memory device according to claim 13, wherein the second program verification voltage is higher than a maximum threshold voltage level of a threshold voltage distribution of a program state of a memory block programmed by the first program method.

15. An operating method of a semiconductor memory device, comprising:
inputting a program command for a selected memory block among a plurality of memory blocks;
checking a program state of the selected memory block according to program mode information for the selected memory block stored in a Content-Addressable Memory (CAM) block among the plurality of memory blocks;
selecting between a first program method, which programs data on an erased memory block, and a second program method, which programs data on a programmed memory block, depending on program mode information for the selected memory block; and
performing a program operation on the selected memory block by the first program method if the selected memory block is a memory block that has only erased memory cells, and performing the program operation for the selected memory block by the second program method if the selected memory block is a memory block that has both the erased memory cells and programmed memory cells.

16. The operating method according to claim 15, further comprising, after performing the program operation, updating the program mode information for the selected memory block stored in the CAM block and storing the updated program mode information.

17. The operating method according to claim 15, wherein:
if it is determined as a result of the checking of the program state of the selected memory block that the selected memory block is a memory block that has only erased memory cells, the program operation is performed by the first program method;
if it is determined that the selected memory block is a memory block programmed by the first program method, the program operation is performed by the second program method; and
if it is determined that the selected memory block is a memory block programmed by the second program method, the selected memory block is erased and then the program operation is performed by the first program method.

18. The operating method according to claim 15, wherein the second program method performs the program operation with a threshold voltage level higher than a maximum threshold voltage level of a threshold voltage distribution of a program state of a memory block programmed by the first program method.

19. An operating method of a semiconductor memory device, comprising:
inputting a read command for a selected memory block among a plurality of memory blocks;
checking a program state of the selected memory block according to program mode information for the selected memory block stored in a Content-Addressable Memory (CAM) block among the plurality of memory blocks;
selecting between a first read method and a second read method depending on program mode information for the selected memory block; and
performing a read operation on the selected memory block by a first read method if the selected memory block is a memory block programmed by a first program method, which programs data on an erased memory block, and performing the read operation on the selected memory block by the second read method if the selected memory block is a memory block programmed by a second program method, which programs data on a programmed memory block.

20. The operating method according to claim 19, wherein a read voltage of the second read method is higher than a maximum threshold voltage level of a threshold voltage distribution of a program state of a memory block programmed by the first program method.

* * * * *